United States Patent [19]

Bazes

[11] Patent Number: 5,036,230
[45] Date of Patent: Jul. 30, 1991

[54] CMOS CLOCK-PHASE SYNTHESIZER

[75] Inventor: Mel Bazes, Haifa, Israel

[73] Assignee: Intel Corporation, Santa Clara, Calif.

[21] Appl. No.: 486,904

[22] Filed: Mar. 1, 1990

[51] Int. Cl.⁵ .......................... H04L 7/08; H03K 5/13; H03K 5/159; H03K 21/36

[52] U.S. Cl. .................................... 307/527; 307/511; 307/528; 307/262; 307/602; 307/595; 328/55; 377/76

[58] Field of Search ............... 307/527, 236, 262, 595, 307/596, 597, 602, 603, 605, 606, 511, 512, 513, 528; 328/55, 56, 11.8; 377/76

[56] References Cited

U.S. PATENT DOCUMENTS

| | | | |
|---|---|---|---|
| 3,588,707 | 6/1971 | Manship | 328/55 |
| 3,633,113 | 1/1972 | Grubel et al. | 307/602 |
| 3,675,133 | 7/1972 | Frankeny et al. | 328/55 |
| 4,119,796 | 10/1978 | Jones | 328/56 |
| 4,496,861 | 11/1985 | Bazes | 307/602 |
| 4,530,107 | 7/1985 | Williams | 307/602 |
| 4,618,787 | 10/1986 | Jacksier et al. | 328/55 |
| 4,637,018 | 8/1984 | Flora et al. | 328/55 |

FOREIGN PATENT DOCUMENTS 0010077 9/1979 European Pat. Off. .
WO87/02490 4/1987 PCT Int'l Appl. .

*Primary Examiner*—Stanley D. Miller
*Assistant Examiner*—David R. Bertelson
*Attorney, Agent, or Firm*—Blakely, Sokoloff, Taylor & Zafman

[57] ABSTRACT

An integrated circuit apparatus for changing the phase relationship between at least one clock-phase output and a reference clock is disclosed. The sequence control apparatus is coupled to a waveform synthesizer apparatus producing at least one clock-phase output. The clock-phase output from the waveform synthesizer is looped back to a skew control apparatus. The deskew control apparatus measures the skew between the falling edge of the clock-phase output and the rising edge of the reference clock and generates a control signal to a shifter. The shifter deskews the clock-phase output automatically with respect to the reference clock by shifting an input pattern to a digital-to-time domain converter (DTC). A sampling window circuit in the deskew control apparatus is coupled to the shifter for reducing the skew between the reference clock and the clock-phase output to a small, well-defined amount. Thus, the present invention generates, without the need for a PLL, at least one clock-phase output from a reference clock which has the same frequency as or smaller than that of the clock-phase output. Finally, a pattern generator coupled to the shifter and under control of a finite state machine in the deskew control provides one of three input signals to the shifter. In one input signal, the clock-phase output is doubled for any number of clock cycles for the purpose of clock-stretching. In another input signal, the duty-cycle of the clock-phase output is changed to any value other than 50%. As such, the present invention stretches the clock-phase and varies the duty-cycle of the clock-phase outputs using CMOS processes.

18 Claims, 14 Drawing Sheets

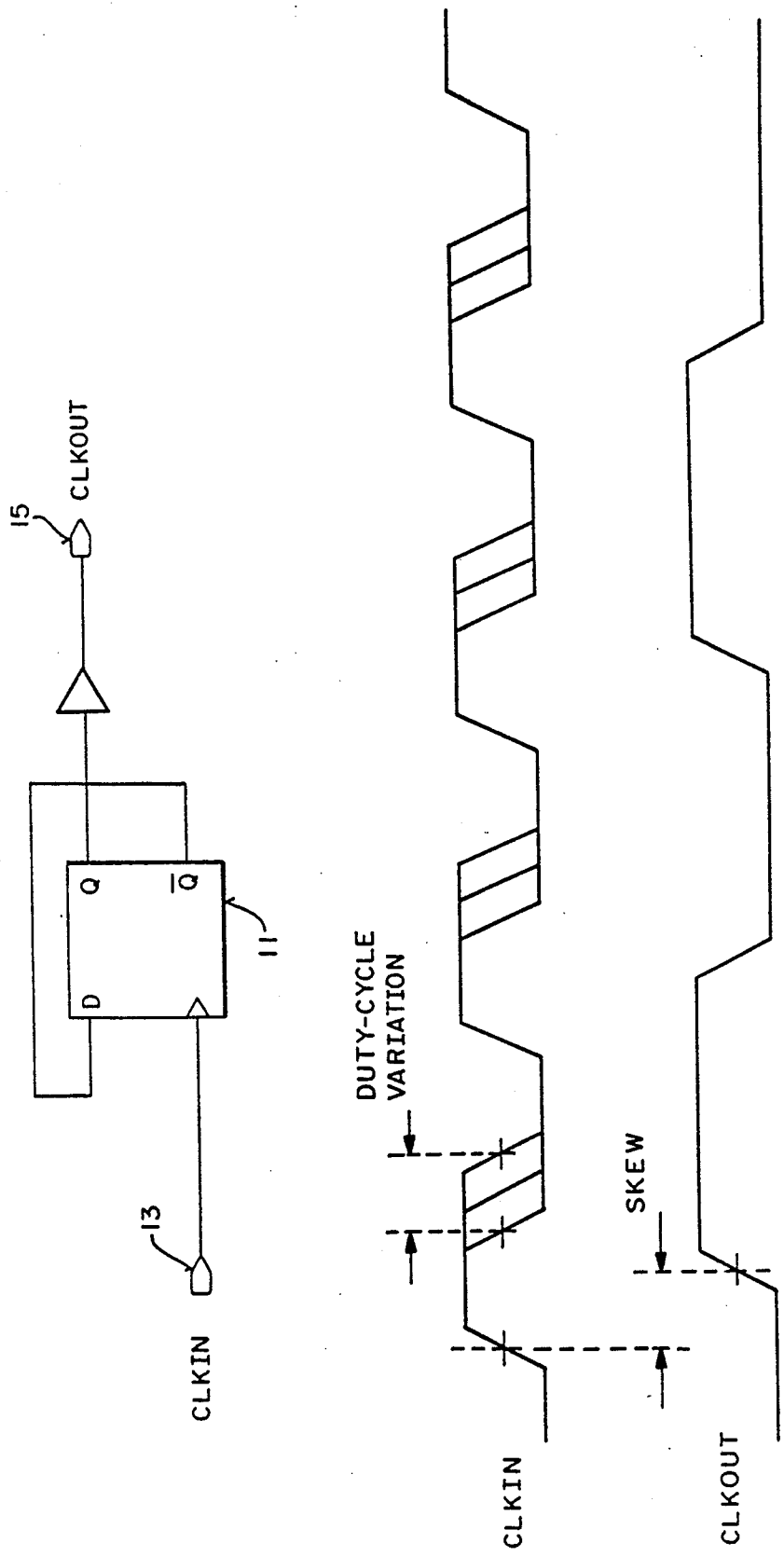
FIG.—1A (PRIOR ART)

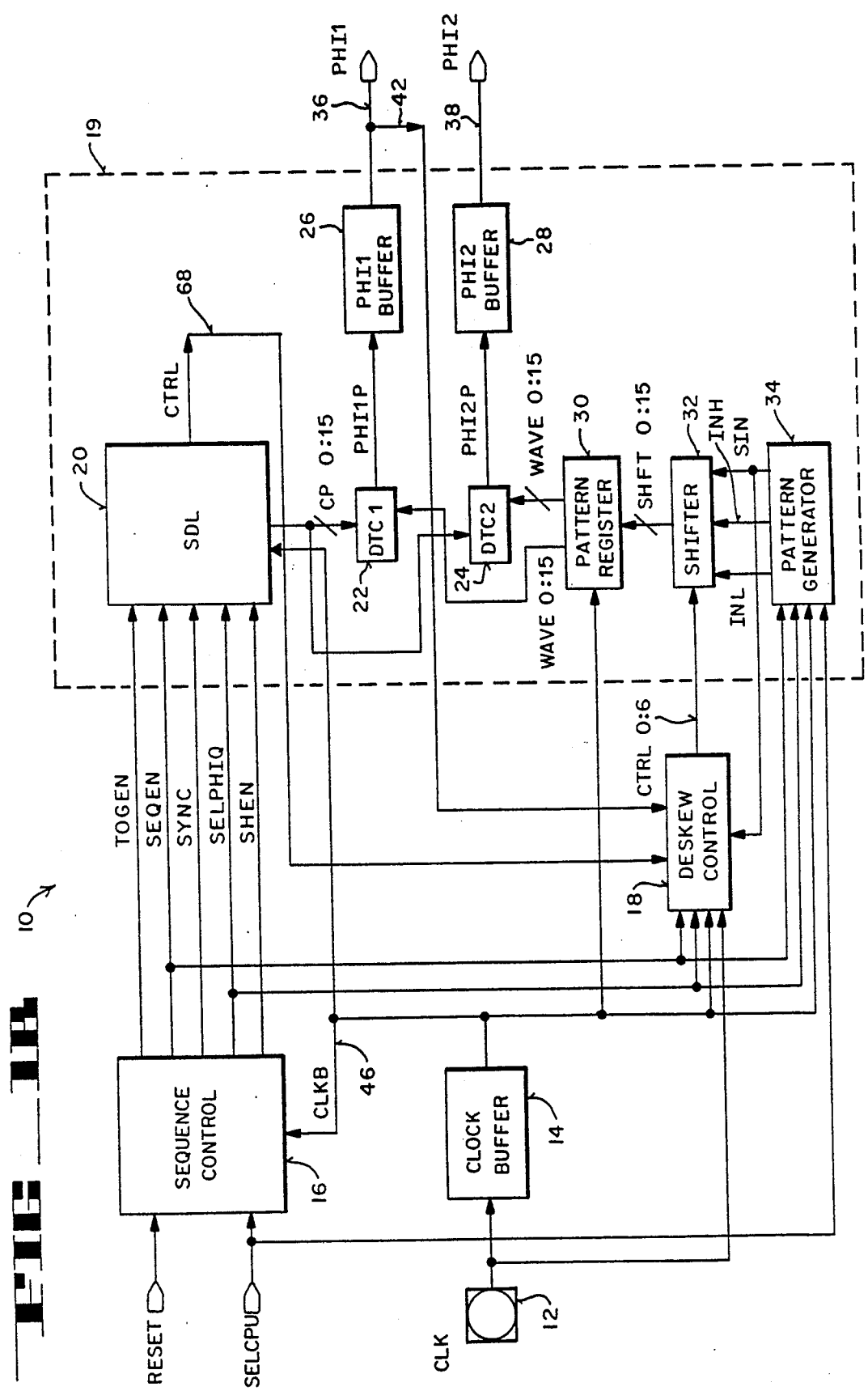
FIG._1B

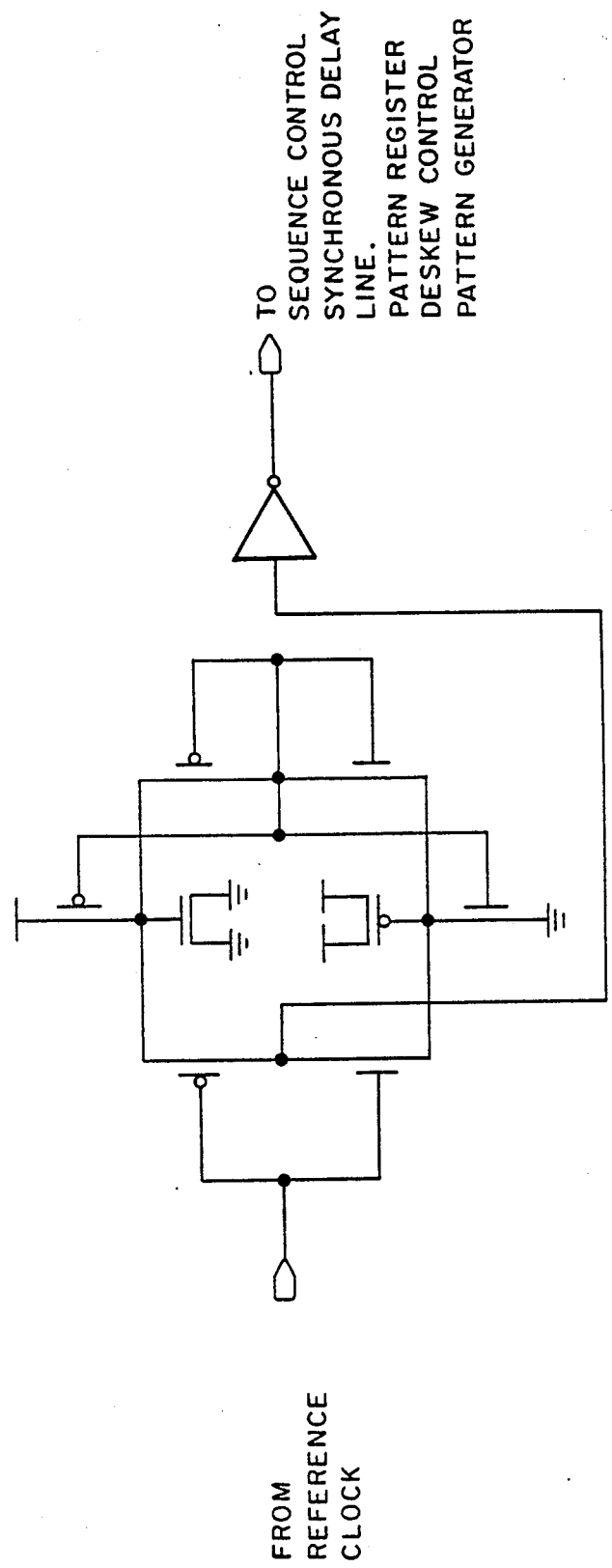
FIG_2

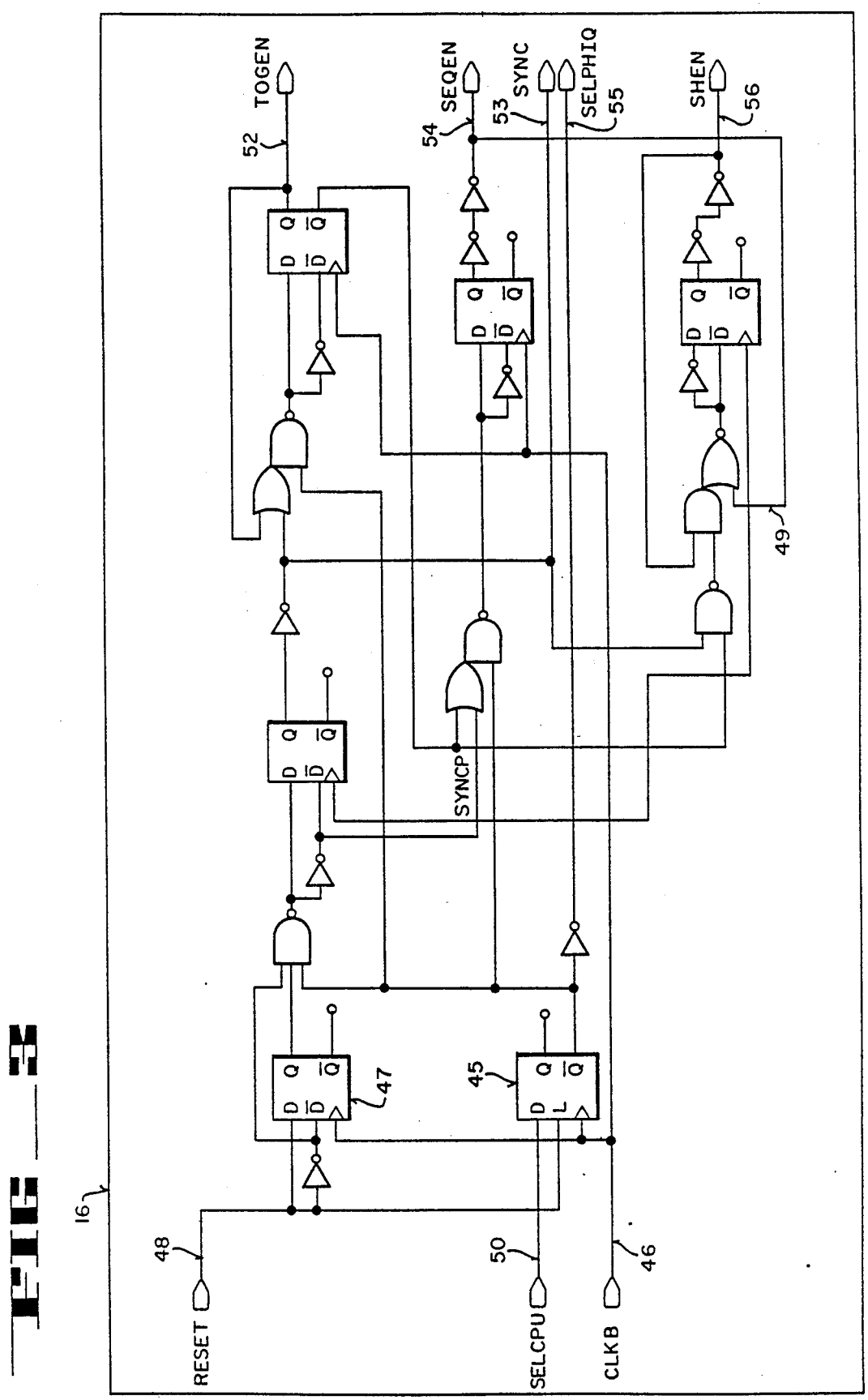
FIG._3

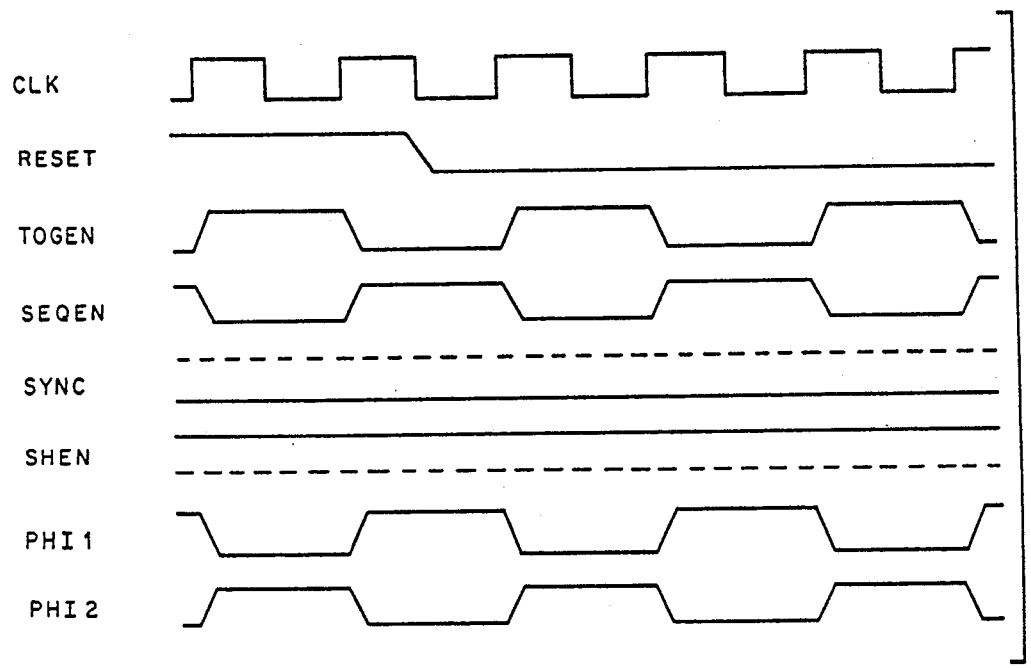
FIG_4A
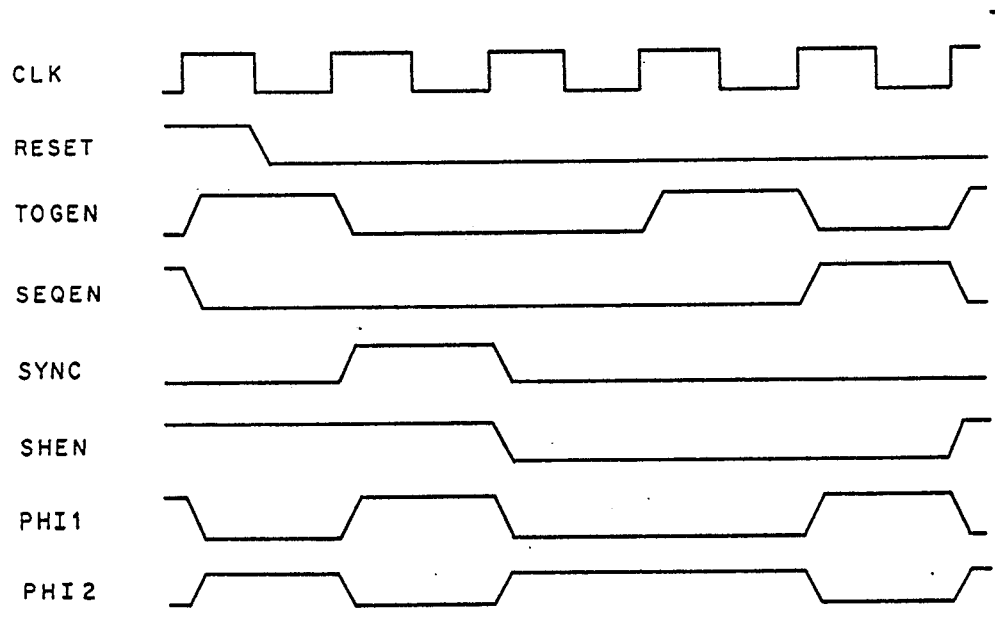
FIG_4B

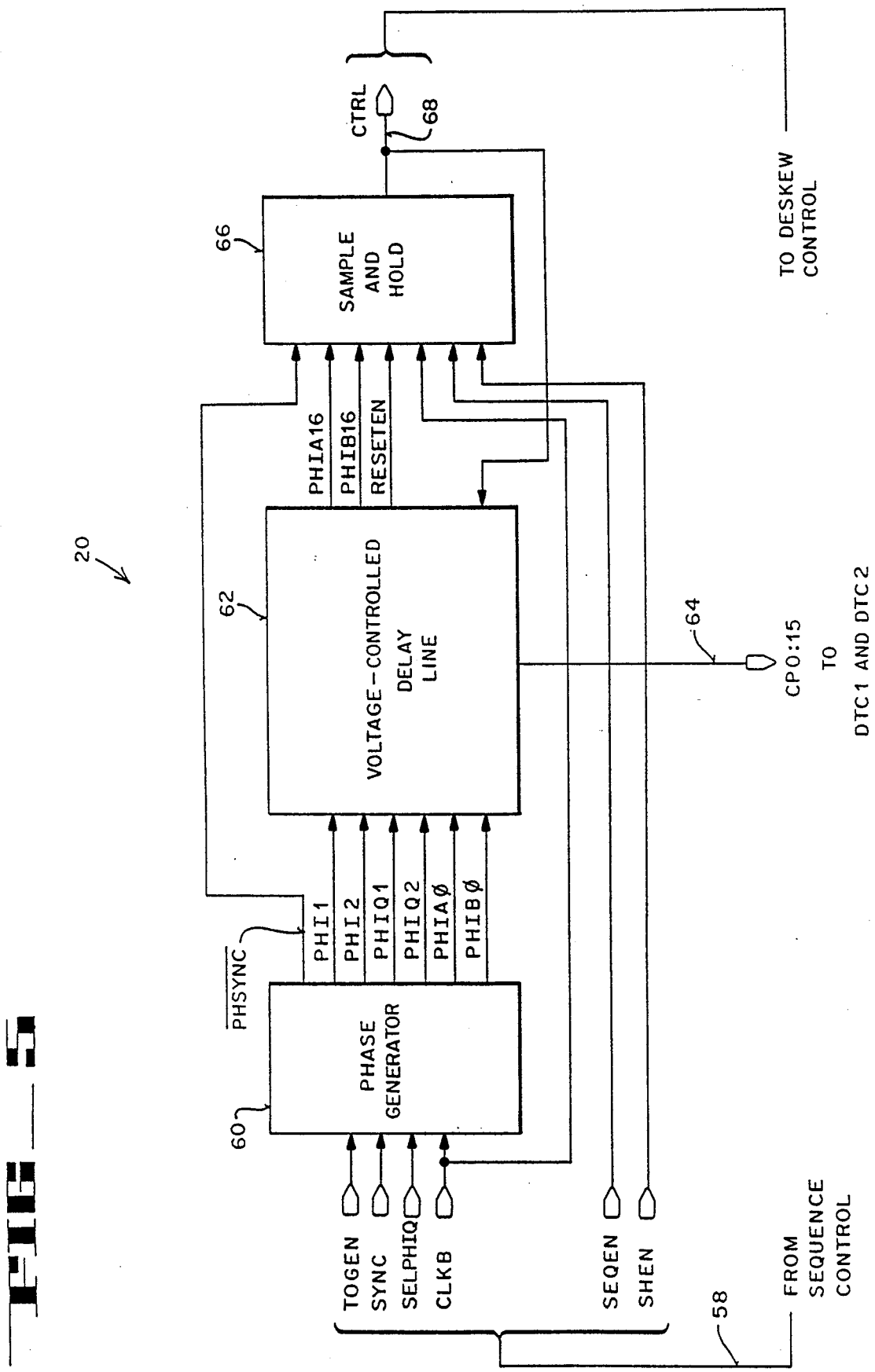

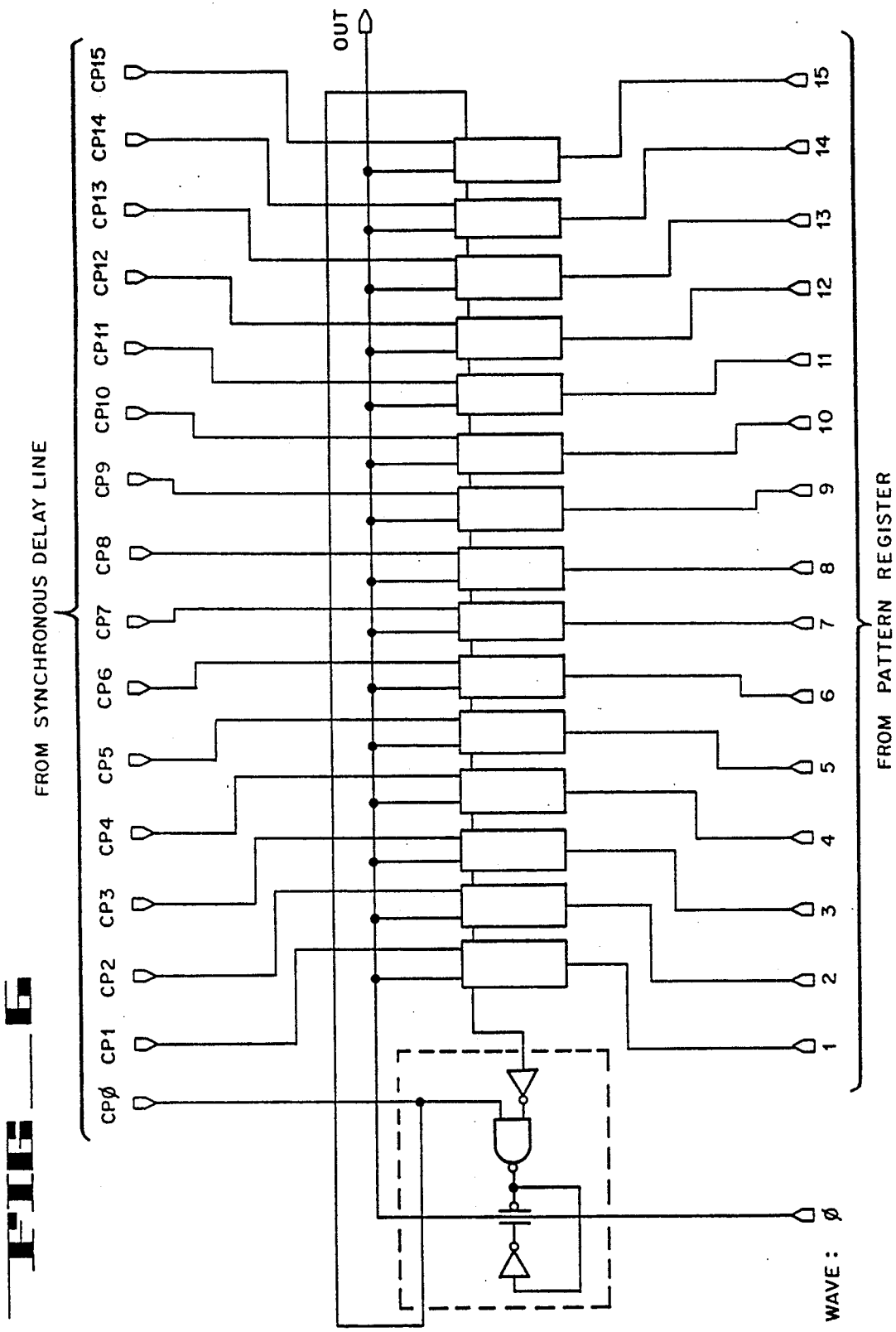

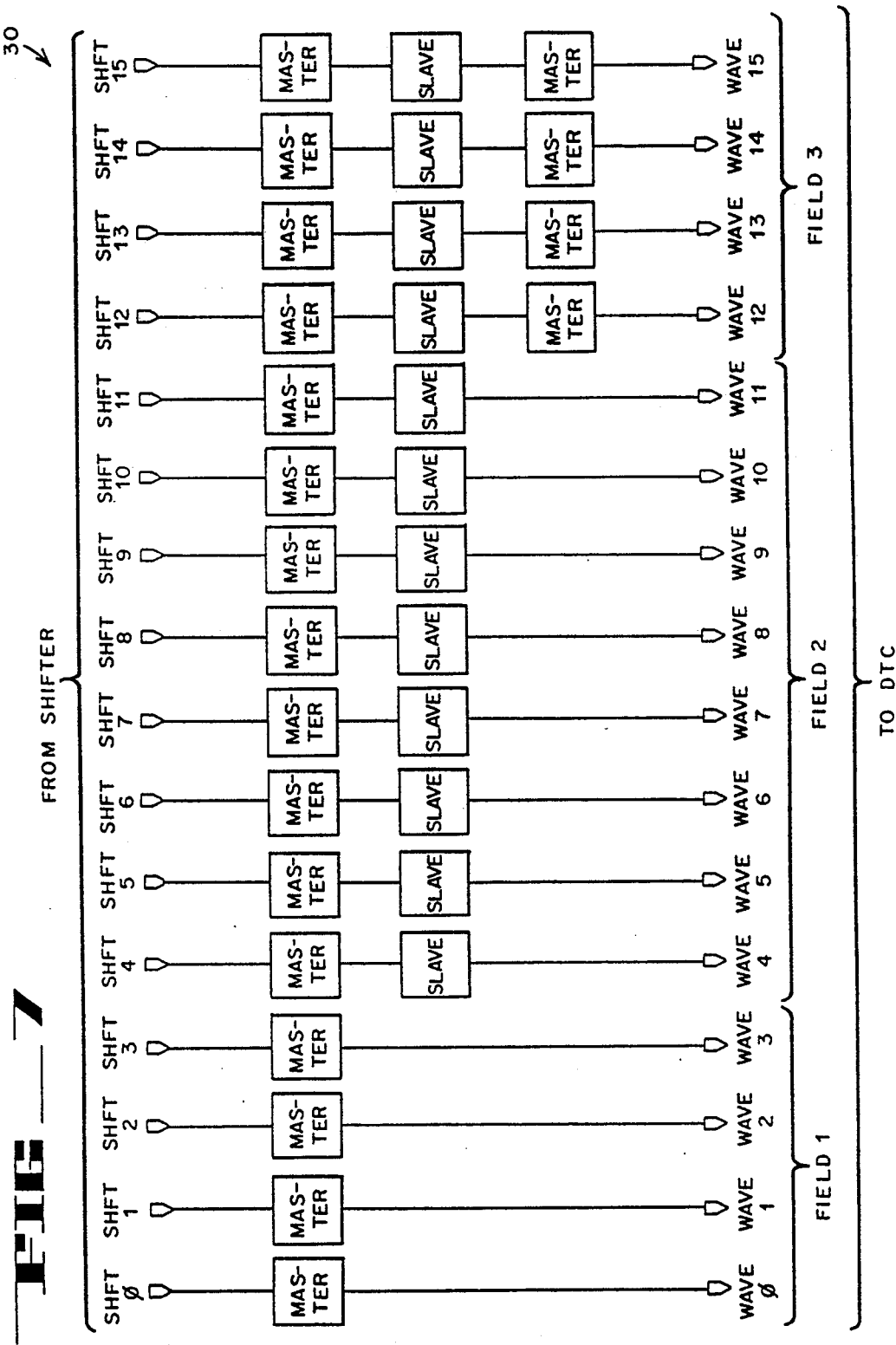
FIG_7

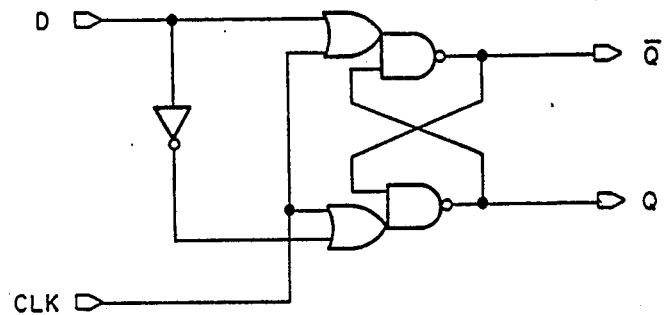
FIG_8A
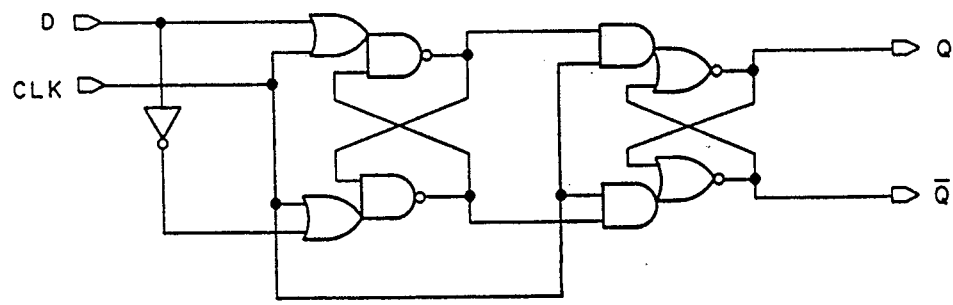
FIG_8B
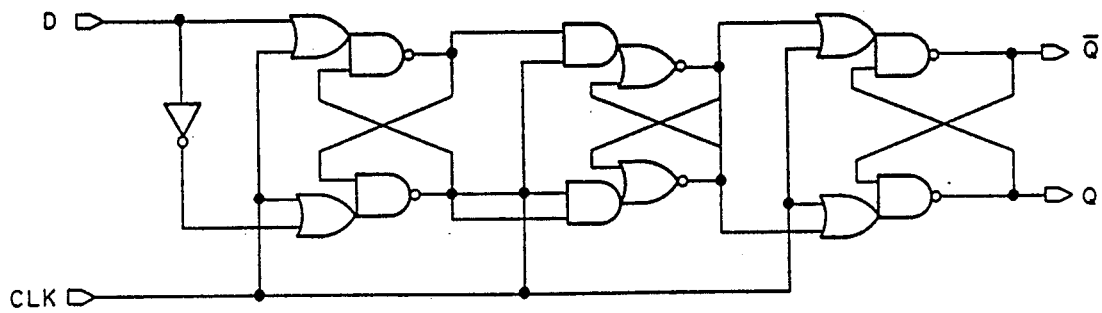
FIG_8C

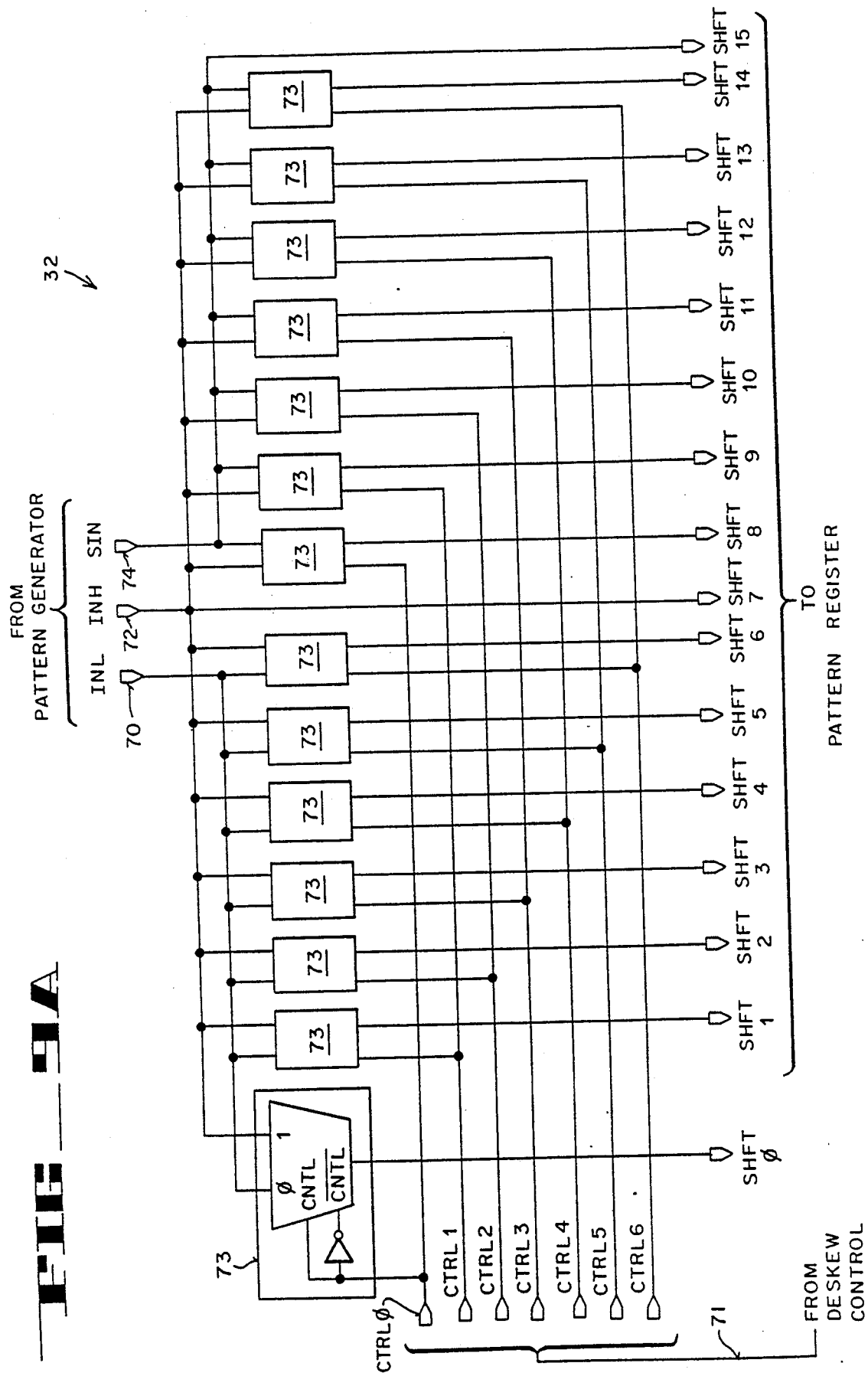

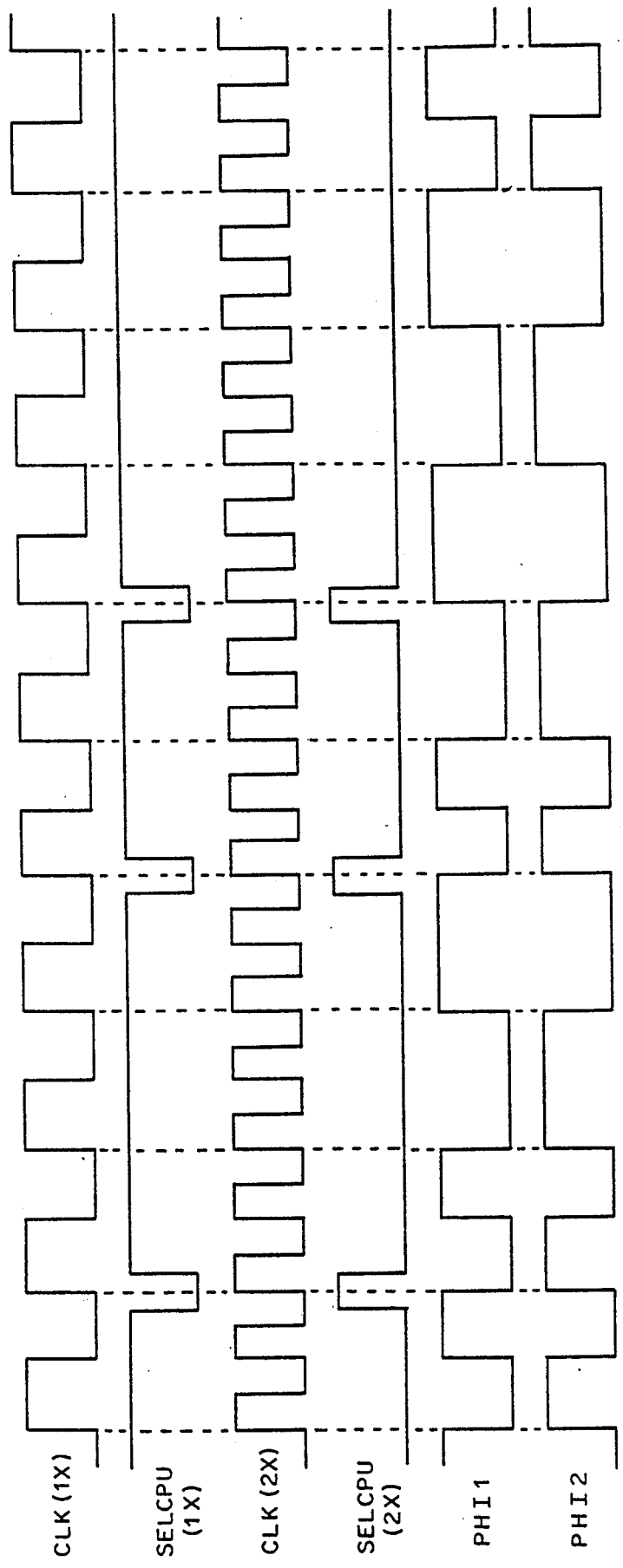

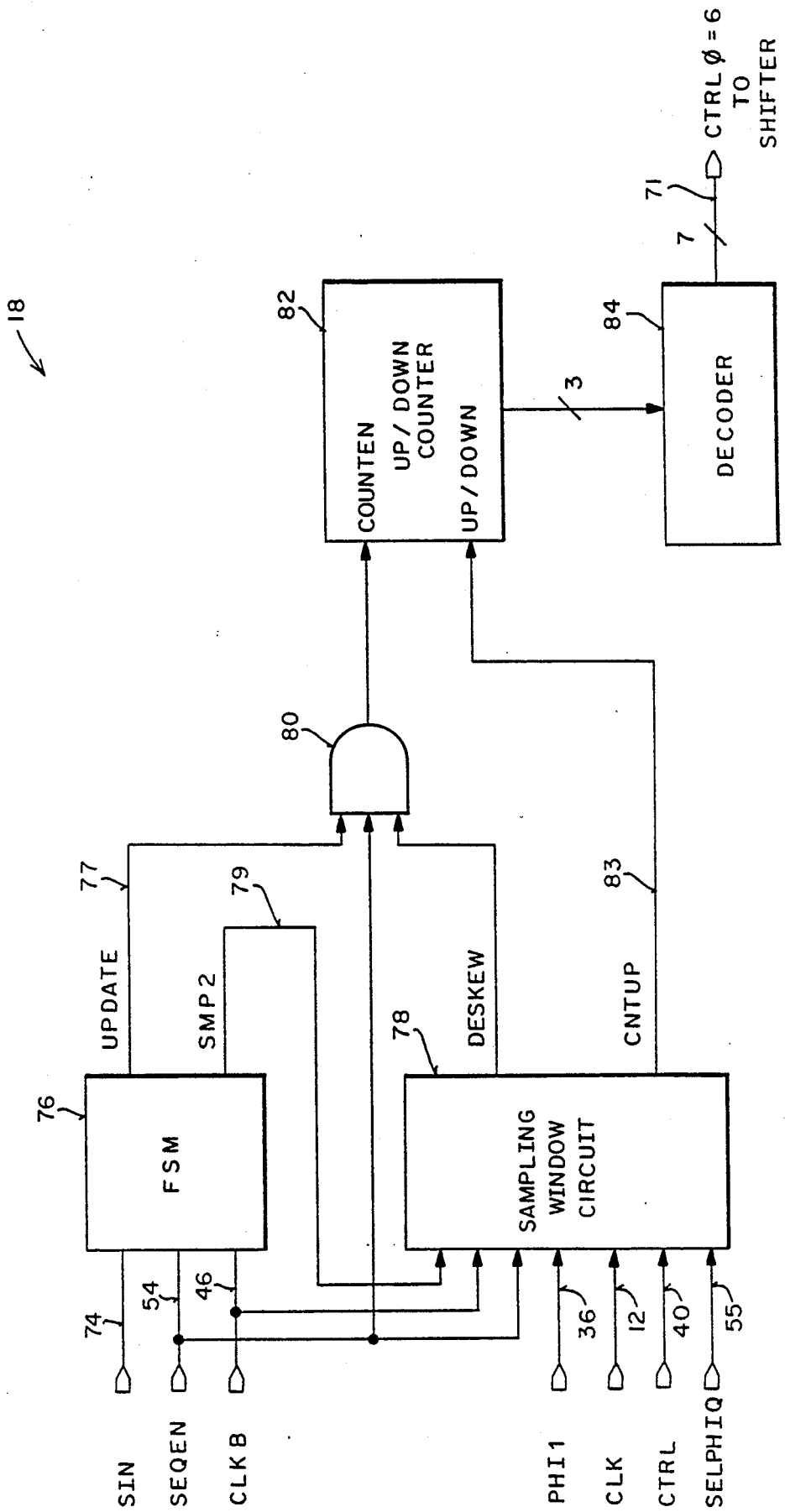
FIG_11A

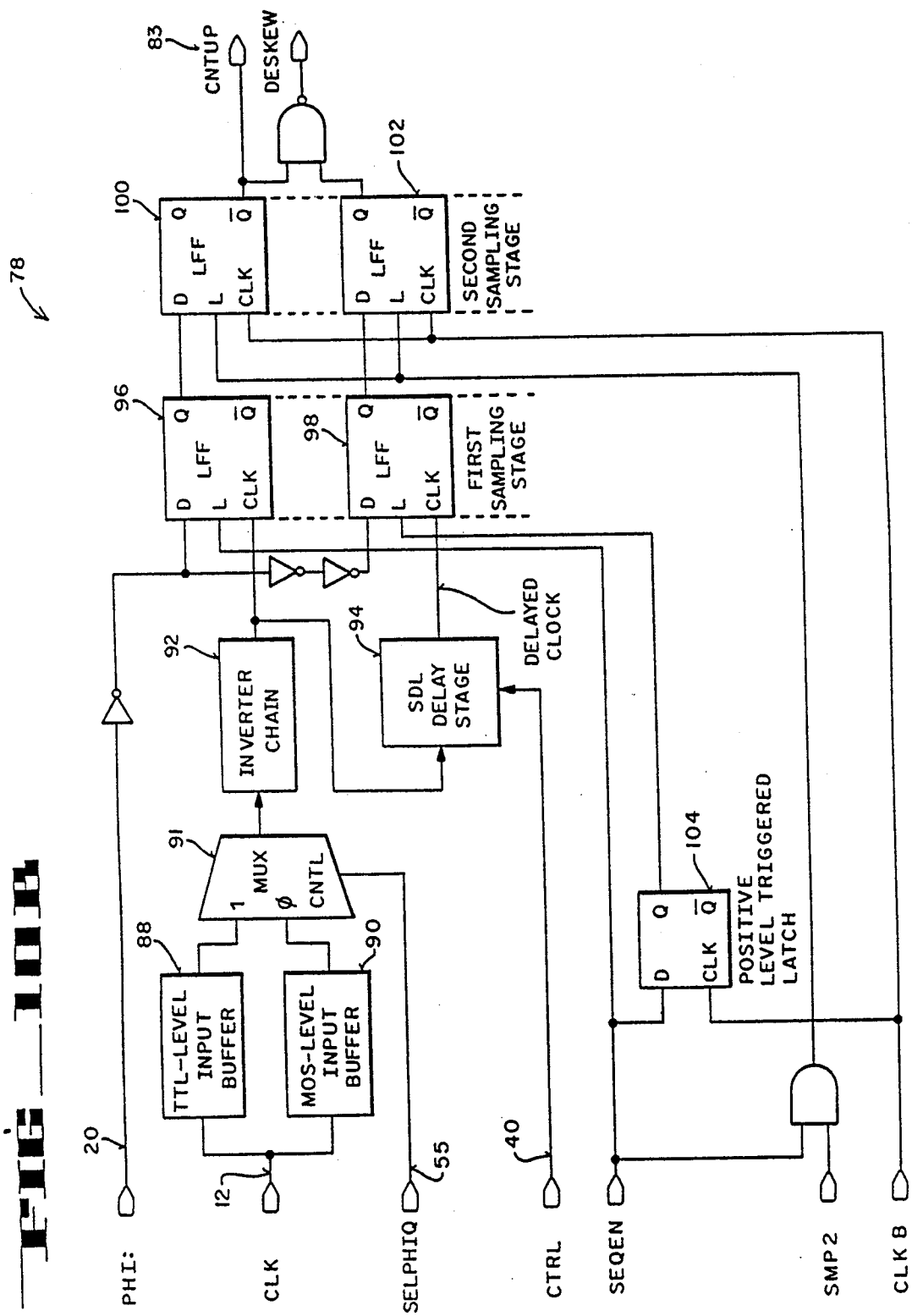

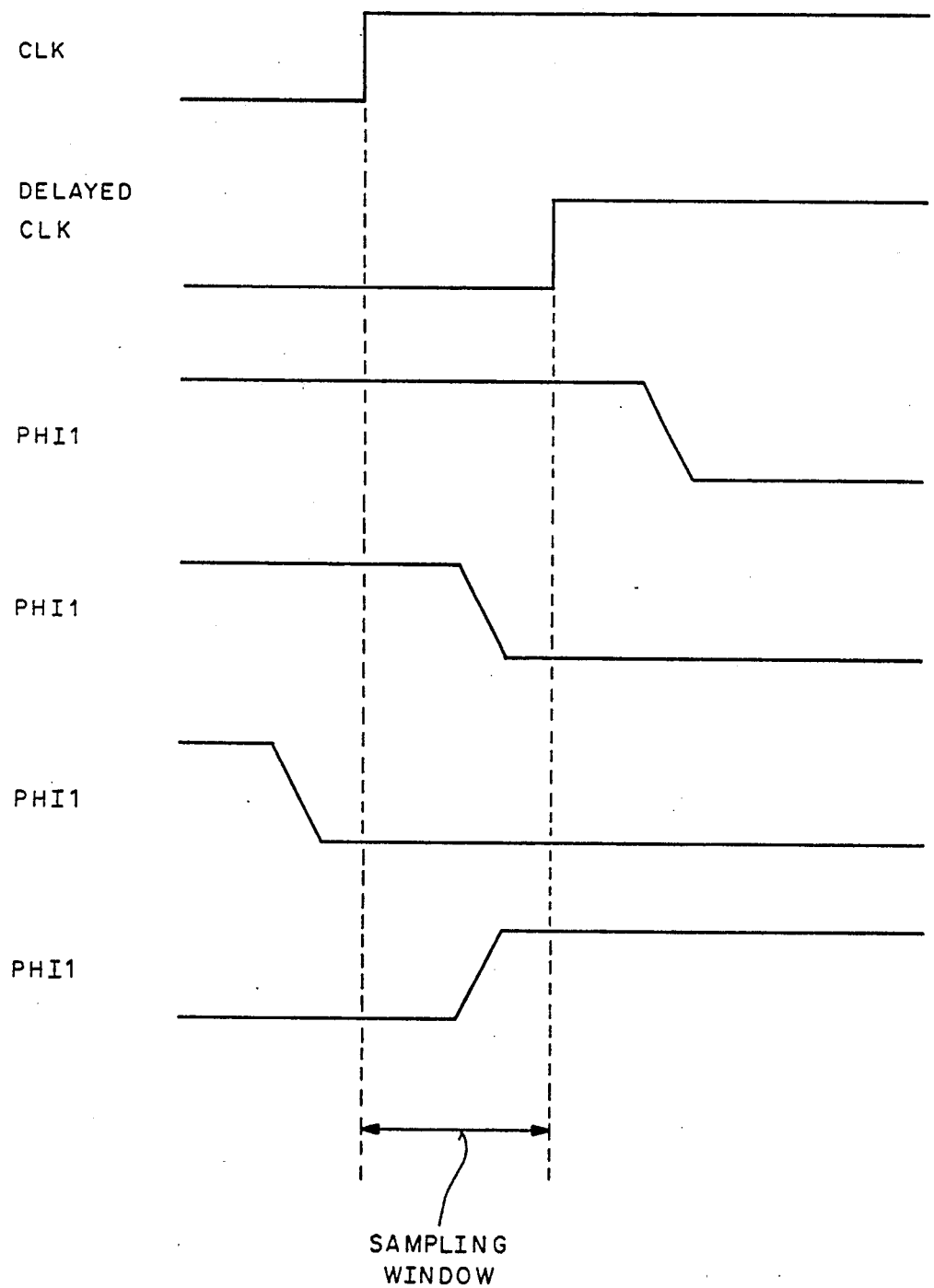
FIG_10C

CMOS CLOCK-PHASE SYNTHESIZER

BACKGROUND OF THE INVENTION

1. FIELD OF THE INVENTION

The invention relates to the field of generating clock-phases required for sequencing the logic of integrated circuits, and in particular, for metal oxide semiconductor (MOS) circuits.

2. ART BACKGROUND

It is quite common for integrated circuits to provide clock-phases for sequencing the logic in a MOS integrated circuit. These clock-phases are used for sequentially enabling the master and slave stages of edge-triggered flip-flops, which serve as the memory elements in sequential logic. These clock-phases are also used to enable the memory arrays and arithmetic logic units of a computer system. The most common method for providing the clock-phases is to divide the frequency of an external reference clock by two. The external reference clock comprises a series of pulse waveforms. The pulse waveforms are generally rectangular and spaced in equal time intervals. After the division-by-two, the resulting signal has a duty-cycle of 50%, irrespective of the duty-cycle of the external reference clock. Duty-cycle refers to the ratio of the average pulse width to the time period of a pulse wave. The division-by-two method also eliminates any variations in the duty-cycle of the external reference clock. Duty-cycle variation refers to the difference in duty-cycle between idealized waveform of the external reference clock and the actual waveform thereof.

A complication arises if it is required that the frequency of reference clock be the same or even smaller than that of the clock-phase output for the integrated circuit. As such, it is no longer possible to divide the reference clock by two in order to overcome the effects of duty-cycle variations in the external reference clock. It is common to overcome the effects of duty-cycle variations in the reference clock by using a phase-locked loop (PLL) in order to multiply the reference clock by two or some other even number multiple and then to divide the resulting clock-phase by some multiple of 2.

The divide-by-two method of generating clock-phase outputs creates a skew between the reference clock and the clock-phase output. Skew refers to the phase difference between the reference clock and the clock-phase output. While this skew is much less variable than that created by the PLL method, it is, nevertheless, significant. Furthermore, the division-by-two method is limited to a single duty-cycle value of 50%.

To implement a PLL in MOS processes introduces further complications. On the one hand, a PLL is very sensitive to processing parameters and operating conditions. On the other hand, MOS technologies are required to operate over large ranges of processing parameters and operating conditions. The phase difference between the reference clock and the clock-phase outputs is a function of PLL parameters. Thus, in MOS, the phase difference is essentially unpredictable. Nevertheless, the skew is a very critical parameter in the operation of integrated circuits. The greater the skew, the worse become the hold-time requirements of the input signals to the integrated circuit and the longer become the delay-times of output signals from the integrated circuits. The hold-time refers to the minimum length of time during which an input signal or data has to be present and stable in order for it to be sampled correctly by the clock-phases. The delay-time refers to the length of time it takes an output signal to propagate from a flip-flop triggered by the clock-phases to the output port of an integrated circuit. It follows that if the skew cannot be controlled, as in the case with PLL, it is impossible to design integrated circuits to meet hold-time and delay-time specification with the consistency required by mass production thereof.

It is therefore an object of the present invention to generate, without the need of a PLL, clock-phases from a reference clock which has a frequency that is equal to or less than that of the clock-phase output. It is a further object of the present invention to reduce the skew between the reference clock and the clock-phase outputs to a small, well-defined amount, irrespective of the processing parameters, temperature, supply voltage, or load capacitances on the clock-phases.

It is yet another object of the present invention to generate clock-phase outputs with duty-cycles of arbitrary values other than 50%. The duty-cycles may be set to any arbitrary values within the resolution set by a synchronous delay line.

It is yet another object of the present invention to stretch the clock-phases in any clock cycle for any number of clock cycles to facilitate the debugging of integrated circuits. By stretching the clock-phase outputs at selected points in time, critical logic paths in the integrated circuit can be identified. For example, say a particular logic path is suspected to fail at high frequency, and that it is known in which clock periods the path is active. By stretching the clock-phases only in those clock periods in which the suspected path is active, the failure of a particular path can be verified.

SUMMARY OF THE INVENTION

An integrated circuit apparatus generates at least two clock-phase outputs through waveform synthesis techniques for sequencing the logic in metal oxide semiconductor (MOS) integrated circuits. A reference clock signal is provided as input to a sequence control apparatus over a clock buffer. The sequence control apparatus selects one of two frequencies without affecting the clock phase outputs. The sequence control apparatus is also coupled to a waveform synthesizer apparatus producing two clock-phase outputs although the number of outputs is a design choice. One of the two clock-phase outputs from the waveform synthesizer is looped back to a deskew control apparatus. The second clock-phase output from the waveform synthesizer is complementary to the first clock-phase output. The deskew control apparatus measures the skew between the falling edge of the first clock-phase output and the rising edge of the reference clock and generates a control signal to the waveform synthesizer so that the falling edge of the first clock-phase output is located within a specified sampling window. The deskew control apparatus is further coupled to a shifter. The shifter deskews the two clock-phase outputs automatically with respect to the reference clock by shifting an input pattern to a digital-to-time domain converter (DTC). A sampling window circuit in the deskew control apparatus and coupled to the shifter reduces the skew between the reference clock and the clock-phase outputs to a small, well-defined amount irrespective of the processing parameters, temperature, supply voltage, or load capacitances on the output clock-phase outputs. Thus, the present invention generates, without the need of a PLL, a plurality of clock-phase outputs from a reference clock which has the same frequency as or smaller than that of the clock-phase outputs. Finally, a pattern generator coupled to the shifter and under control of a finite state machine in the deskew control provides one of three input signals to the shifter. In one input signal, the clock-phase output is doubled for any number of clock cycles for the purpose of clock-stretching. In another input signal, the duty-cycle of the clock-phase output is changed to any value other than 50%. It follows that the present invention also stretches the clock-phase and varies the duty-cycle of the same using CMOS processes.

BRIEF DESCRIPTION OF THE DRAWINGS

FIG. 1A is a prior art divide-by-two circuit and shows a timing diagram of the input and output signals of the divide-by-two circuit.

FIG. 1B is a block diagram illustrating the preferred embodiment of the present invention.

FIG. 2 is an electrical schematic of a clock input buffer used in the presently preferred embodiment of the invention.

FIG. 3 is an electrical schematic of a sequence control apparatus used in the presently preferred embodiment of the invention.

FIG. 4A is a timing diagram of the sequence control apparatus signals when no synchronization to reset-going-inactive is required.

FIG. 4B is a timing diagram of the sequence control apparatus signals when synchronization to reset-going-inactive is required.

FIG. 5 is a block diagram of a synchronous delay line (SDL) used in the waveform synthesizer in the presently preferred embodiment of the invention.

FIG. 6 is an electrical schematic of a digital-to-time domain converter (DTC) used in the waveform synthesizer in the presently preferred embodiment of the invention.

FIG. 7 is an electrical schematic of a pattern register in the waveform synthesizer used in the presently preferred embodiment of the invention.

FIG. 8A is an electrical schematic of a master flip-flop used as part of the waveform pattern register in the presently preferred embodiment of the invention.

FIG. 8B is an electrical schematic of a master-slave flip-flop used in the waveform pattern register in the presently preferred embodiment of the invention.

FIG. 8C is an electrical schematic of a master-slave-master triad used in the waveform pattern register in the presently preferred embodiment of the invention.

FIG. 9A is an electrical schematic of a shifter used in the waveform synthesizer in the presently preferred embodiment of the invention.

FIG. 9B is a timing diagram of the clock stretching function provided by the pattern generator in the presently preferred embodiment of the invention.

FIG. 10A is a block diagram of the deskew control used in the presently preferred embodiment of the invention.

FIG. 10B is a timing diagram illustrating the four possibilities of the output clock-phase being sampled by the sampling window circuit.

FIG. 10C is an electrical schematic of a sampling window circuit used as part of the deskew control in the presently preferred embodiment of the invention.

DETAILED DESCRIPTION OF THE INVENTION

An integrated circuit is disclosed for generating internal clock-phases through waveform synthesis techniques for sequencing the logic of a MOS integrated circuit. In the following description, numerous specific details are set forth such as specific circuits in order to provide a thorough understanding of the present invention. It will be obvious, however, to one skilled in the art, that the present invention may be practiced without these specific details. In other instances, well known circuits are not described in detail in order not to unnecessarily obscure the present invention. In the presently preferred embodiment, the invention is realized as part of a metal oxide semiconductor (MOS) integrated circuit. The invention may be fabricated employing any of the many well-known MOS processes or complementary metal oxide semiconductor (CMOS) processes.

The most common method for providing clock-phases(s) in sequencing the logic in a MOS integrated circuit is to divide the frequency of an external reference clock by two. FIG. 1A illustrates a prior art divide-by-two circuit and the timing diagram of its input and output waveforms. The divide-by-two circuit 11 comprises a D type flip-flop with its D input tied to its own $\overline{Q}$ output. See Horowitz, P. and Hill, W. *The Art of Electronics* (Cambridge University Press, 1980), pp. 345–346. An external reference clock, CLKIN 13, provides an input signal to the circuit 11. The waveform of CKLIN comprises a series of pulse waveforms, preferably rectangular, and spaced in equal time periods. In practice, the external reference waveform deviates quite a bit from the idealized pulse waveform. This difference is called duty-cycle variation. Duty-cycle refers to the ratio of the average pulse width to the time period of a pulse wave. The duty-cycle variation is illustrated in FIG. 1A by superimposing the idealized waveform over the actual external reference waveform 13. The duty-cycle variation can be eliminated by dividing the CLKIN 13 by two using the circuit 11, producing an output signal CLKOUT 15. As expected, the waveform of CLKOUT 15 does not have any duty-cycle variation and has a 50% duty-cycle. However, the divide-by-two method produces a skew between the clock phase output and the reference clock-phase. The skew is thus illustrated as the phase difference between the rising edge of the clock phase output 15 and the reference clock-phase 13 in FIG. 1A.

A complication arises if it is required that the reference clock frequency be the same, or even smaller, than that of the clock-phases of the integrated circuit. As such, it is no longer possible to divide the external reference clock by two in order to overcome the effects of duty-cycle variations in the external reference clock. Instead, an analog phase-locked loop (PLL) is used to multiply the reference frequency by two or some other even-numbered multiple, and then to divide the resulting frequency by some multiple of two. See Horowitz, P. and Hill, W. *The Art of Electronics* (Cambridge University Press, 1980) pg. 432.

The use of a PLL to eliminate duty-cycle variations is difficult when it is implemented in MOS or CMOS processes. PLLs are sensitive to processing parameters and operating conditions. In contrast, MOS integrated circuits are required to operate over large ranges of processing and operating conditions. Furthermore, just as there is a skew under the divide-by-two method, there is also a skew between the clock-phase output and the reference clock-phase in PLL. While the skew in the divide-by-two method depends on the number of logic gates intervening between the reference clock and clock-phase outputs, the skew between the reference clock and the clock-phase outputs in a PLL is a function of processing parameters and operating conditions. Because MOS integrated circuits operate in large ranges of processing and operating conditions, the skew in PLL is generally unpredictable. Nevertheless, the skew is a very critical parameter in the operation of integrated circuits. The greater the skew, the worse become the hold-time requirements of the input signals to the integrated circuit and the longer become the delay-times of output signals from the integrated circuit. If the skew cannot be controlled, as in the case with PLL, it is impossible to design integrated circuits to meet hold-time and delay-time specification with the consistency required by the mass production thereof.

FIG. 1B is a block diagram illustrating the preferred embodiment of a CMOS clock-phase synthesizer 10 to generate a plurality of clock-phases for sequencing the logic of a MOS integrated circuit. A clock buffer 14 is shown receiving a reference clock signal 12 as input, and the buffered output of the clock buffer 14 is coupled to a sequence control 16, a deskew control 18, and to a waveform synthesizer 19. The waveform synthesizer 19 further comprises a synchronous delay line 20 (SDL) coupled to at least two digital-to-time domain converters DTC 22 and DTC 24. DTC 22 and DTC 24 further receive input from a pattern register 30, and a pattern generator 34 provides waveforms to the pattern register 30 over a shifter 32. At least two clock-phase outputs PHI1 36 and PHI2 38 emerge from at least two clock-phase buffers 26 and 28 which in turn receive output signals from the DTC 22 and 24, respectively. The clock-phase outputs PHI1 36 and PHI2 38 are then used to sequence the logic in a MOS integrated circuit. The clock-phase outputs 36 and 38 have frequencies which are equal to or greater than that of the reference clock signal 12.

The preferred embodiment of the waveform synthesizer 19, including the DTC 22 and 24, and the pattern register 30 for use with the present invention, are described in the pending patent application, Ser. No. 07/444,670, filed on Dec. 1, 1989 and entitled "METHOD AND APPARATUS FOR SYNTHESIZING DIGITAL WAVEFORMS". Furthermore, the preferred embodiment of the SDL 20 for use with the present invention is described fully in the pending patent application, Ser. No. 07/434,408, filed on Nov. 13, 1989 and entitled "SYNCHRONOUS DELAY LINE WITH QUADRATURE CLOCK PHASES". Although the SDL in 07/434,408 shows eight taps, TAP 0:7, it should be understood by one skilled in the art that producing sixteen taps, CP 0:15, for the presently preferred embodiment merely requires the addition of eight voltage controlled delay (VCD's) stages. Prior art techniques of utilizing a synchronous delay line are also described in the pending patent application, Ser. No. 07/434,340, filed on Nov. 13, 1989 and entitled "SYNCHRONOUS DELAY LINE WITH AUTOMATIC RESET", in U.S. Pat. No. 4,496,861 entitled "INTEGRATED CIRCUIT SYNCHRONOUS DELAY LINE", and in an article entitled "A Novel Precision MOS Synchronous Delay Line", IEEE Journal of Solid State Circuits, Volume SC-20, pp. 1265-1271, December, 1985.

The buffered reference clock may operate in either one of two modes in the preferred embodiment:
1. MOS-level, running at double the internal frequency.
2. TTL-level, running at the internal frequency.

In both modes of the clock buffer 14, the clock-phase outputs 36 and 38 are substantially unaffected by the duty-cycle or voltage levels of the reference clock.

FIG. 2 is an electrical schematic of the clock buffer 14. The clock buffer 14 consists of a TTL-to-CMOS input buffer and a driver for driving the clock logic of the clock-phase synthesizer 10. The input buffer in FIG. 2 is based on the complementary self-biased differential amplifier (CSDA). The CSDA is described fully in the pending patent application, Ser. No. 07/207,688, filed on June 16, 1988 and entitled "SELF-BIASED, HIGH-GAIN DIFFERENTIAL AMPLIFIER". The same buffer has a logic threshold of 1.4 volts under nominal conditions. Under extreme conditions of processing temperatures and voltages, the threshold voltage is within the TTL range of 0.8 V to 2.0 V. The clock buffer 14 receives an input signal from the reference clock 12. The clock buffer 14 provides a buffered reference clock signal 46 to sequence control 16, deskew control 18, SDL 20, pattern register 30, and pattern generator 34.

FIG. 3 is an electrical schematic of the sequence control 16 used in the preferred embodiment of the present invention. The sequence control 16 comprises at least one L-type flip-flop 45 and a plurality of D-type flip-flops. An external reset line RESET 48 is coupled to the flip-flop 45 and the flip-flop 47. The clock inputs of all the flip-flops in the sequence control 16 are coupled to a buffered clock line CLKB 46 which is the clock output from the clock buffer 14 as shown in FIG. 1B and 2. A sampled line SELCPU 50 is coupled to a flip-flop 45 in the sequence control 16, providing information on which one of the two clock modes the circuit is to operate. The sequence control 16 provides several global signals for sequencing the logic of the clock-phase synthesizer 10 and for triggering the SDL 20. The sequence control 16 also permits the buffered reference clock 46 to operate in either of two modes (MOS or TTL) without affecting the clock-phase output as mentioned earlier.

The logic of the clock-phase synthesizer 10 is based on single-phase edge-triggered flip-flops and level-triggered latches. The sequence control 16 samples SELCPU 50 on the falling edge of RESET 48. The rising edge of CLKB 46 which follows the falling edge of RESET 48 latches SELCPU 50 synchronously. As long as RESET 48 is high, SELCPU 50 is sampled on every clock. When RESET 48 goes low, sampling of SELCPU 50 is disabled, and whatever value of SELCPU was sampled on the previous clock is the final value. The sampled value of SELCPU 50 is SELPHIQ 55, and it is coupled to the SDL 20, the deskew control 18 and the pattern generator 34. The SELPHIQ 55 is a static signal that informs the control logic of the clock-phase synthesizer 10 which of the two clock modes (MOS or TTL) the CLKB 46 is in. If CLKB 46 is in TTL mode, the SELPHIQ 55 causes one-half-clock delays to be implemented as level-triggered latches. If CLKB 46 is in MOS mode, one-half-clock delays are implemented as edge-triggered flip-flops. The SELPHIQ 55 also switches the reference clock 12 in a sampling window circuit 78 of the deskew control 18, to a TTL input buffer 88 when the CLKB 46 is in TTL mode and to a MOS input buffer when the CLKB 46 is in MOS mode.

Referring again to FIG. 1B and 3, the remaining output signals of the sequence control 16 do not toggle when the CLKB 46 is in TTL mode. However, when the CLKB 46 is in MOS mode, the remaining output signals of the sequence control 16 each toggle and perform the following functions. A TOGEN 52 is coupled to the SDL 20, and is used to halve the toggling rate of the SDL 20. Therefore, when the CLKB 46 is in MOS mode, TOGEN 52 causes the effective clock frequency of the SDL to be half of that of the external reference clock 12. Just as TOGEN 52 halves the frequency of SDL, the SEQEN 54 halves the clocking frequency of the L-type flip-flops in the deskew control 18, SDL 20, and pattern generator 34. On the other hand, a SYNC 53 is coupled to SDL 20 and freezes the SDL 20 momentarily to synchronize the SDL with the falling edge of RESET 48. Finally, a sample and hold enable signal SHEN 56 is coupled to a sample and hold circuit 66 in the SDL 20. The SHEN 56 signal disables the sample and hold circuit 66 momentarily whenever the SDL 20 is synchronized with the falling edge of the RESET 48 signal. Otherwise, the SDL control signal CTRL 68 could be disturbed during synchronization and cause a momentary distortion of the clock-phase outputs 36 and 38.

In FIG. 1B, the signals from the sequence control 16, as well as the clock buffer 14, provide inputs to the waveform synthesizer 19. The waveform synthesizer 19 is disclosed in greater detail in the pending patent application by Ser. No. 07/444,670, filed Dec. 1, 1989 and entitled "METHOD AND APPARATUS FOR SYNTHESIZING DIGITAL WAVEFORMS". There, the waveform synthesizer comprises SDL, a DTC, a pattern register, an optional shifter, and a pattern generator. The waveform synthesizer produces a digital waveform from a reference clock signal. In the presently preferred embodiment of the invention, an additional DTC is provided. Furthermore, at least two clock-phase buffers 26 and 28 are provided to render the clock-phase outputs 36 and 38. The timing diagram of the sequence control 16 signals for the case of RESET 48 going low while PHI1 is high is illustrated in FIG. 4A. In this situation, SYNC remains inactive-low, SHEN remains high and TOGEN and SEQEN continue to toggle, unaffected. The timing diagram of the sequence control 16 signals for the case of RESET 48 going low while PHI2 is low; i.e. where synchronization takes place is illustrated in FIG. 4B. As can be seen, SYNC 53 goes active-high on the first CLKB rising edge after RESET goes low. The falling edge of SYNC stretches PHI1 and PHI2 an extra CLKB cycle. SHEN goes low at the end of the first complete CLKB cycle after RESET falls. SEQEN and TOGEN are both held low on the first CLKB rising edge after RESET goes low. SEQEN and TOGEN begin toggling again on the second CLKb rising edge afterward. The clock-phase synthesizer 10 synchronizes to the falling edge of reset even when the SDL 20 is not in the steady-state.

FIG. 5 is a block diagram of the synchronous delay line (SDL) used with the waveform synthesizer in the presently preferred embodiment of the invention. The SDL 20 is described in greater detail in U.S. Pat. No. 4,496,861, issued on Jan. 29, 1985, to Applicant and in the patent application, Ser. No. 07/434,408, filed on Nov. 13, 1989 and entitled "SYNCHRONOUS DELAY LINE WITH QUADRATURE CLOCK PHASES". The phase generator 60 is coupled to the sequence control 16 and receives input signals 58 from the same. The phase generator 60 is further coupled to a voltage-controlled delay line 62 and a sample and hold circuit 66, and provides SDL clock-phases that control the operation of the SDL 20. The voltage controlled delay line 62 receives input signals from the phase generator 60 and produces signals with delay taps 64 CP0:15. While the preferred embodiment of the SDL incorporates 16 delay taps, U.S. Pat. No. 4,496,861 teaches that any arbitrary number, N, of delay taps may be implemented. The voltage controlled delay line 62 comprises 16 delay stages. Each stage outputs one of the SDL outputs 64, CP0:15. A chain of NAND/inverter pairs sample the SDL outputs and generate SDL reset if the SDL is not in its fundamental mode of operation. The operation of the reset circuit is described fully in the pending patent application, Ser. No. 07/434,340, filed on Nov. 13, 1989 and entitled "SYNCHRONOUS DELAY LINE WITH AUTOMATIC RESET". The sample and hold circuit 66 is coupled to the voltage-controlled delay line 62 and phase generator 60 and samples the outputs of the voltage control delay lines on alternate clocks. The sampled voltage is attenuated by a switched capacitor to generate the SDL control signal CTRL 68 which is a static analog voltage and is used by the deskew control 18.

FIG. 6 is an electrical schematic of a digital-to-time domain converter (DTC) used in the presently preferred embodiment of the invention. The identical DTC is described in greater detail in the pending patent application, Ser. No. 07/444,670, filed on Dec. 1, 1989, entitled "METHOD AND APPARATUS FOR SYNTHESIZING DIGITAL WAVEFORMS". DTC 22 and DTC 24 are coupled to the voltage-controlled delay line 62 and receive as inputs delay taps 64 CP0:15. At the same time, DTC 22 and DTC 24 are coupled to the pattern register 30 and receive as inputs complementary waveforms WAVE 0:15 and $\overline{\text{WAVE 0:15}}$, respectively. DTC 22 and DTC 24 are coupled to the output clock-phase buffers 26 and 28 and synthesize dynamic waveforms PHI1P and PHI2P, respectively. DTC 22 and DTC 24 convert the static patterns of CP0:15 and WAVE 0:15 into dynamic waveforms. CP15 is aligned with the rising edge of the reference clock 12, triggering the first bit in the pattern on the second, and succeeding bits are triggered by CP0:14. It follows that the bit pattern must be rotated by one bit in order for the DTC 22 and 24 to output them in the proper order. The bit patterns for the clock-phases are stored in this rotated form in order to provide a clock-phase waveform which switches at the start of a clock period. It should be understood by one skilled in the art that the present invention has the ability to output any arbitrary number of clock-phases, including odd number 3 or 5. To produce additional number of clock-phases, one merely adds an equal number of DTCs and clock-phase buffers. In contrast, the prior art techniques produce only one, two or four clock-phases.

FIG. 7 is an electrical schematic of a pattern register 30 of the clock-phase synthesizer 10 used in the presently preferred embodiment of the invention. Once again, the pattern register 30 is fully disclosed in the pending patent application, Ser. No. 07/444,670, filed Dec. 1, 1989, entitled "METHOD AND APPARATUS FOR SYNTHESIZING DIGITAL WAVEFORMS". The pattern register 30 is coupled to the shifter 32 and receives therefrom signal SHFT0:15. The pattern register 30 is further coupled to the DTC 22 and DTC 24, respectively, and provides thereto complementary waveform patterns WAVE 0:15 and $\overline{\text{WAVE 0:15}}$. The pattern register 30 comprises three fields of pattern registers, FIELD 1, FIELD 2, AND FIELD 3. As such, the pattern register 30 is implemented with varying depths of master and slave flip-flop stages. FIELD 1 is implemented as solitary master flip-flop stages as illustrated in FIG. 8A. It follows that WAVE 0:3 are delayed by ½ clock and become valid before the first tap in the first SDL field (i.e., CP0) goes high and remains valid until the last tap in the first SDL (i.e., CP3) field goes high. FIELD 2 is implemented as master-slave pairs. As a result, WAVE 4:11 are delayed by a full clock and become valid before the first tap of the second SDL field (i.e., CP4) goes high and remains valid until after the last tap of the second SDL field (i.e., CP11) goes high. See FIG. 8B. Finally, FIELD 3 is implemented as a master-slave-master triad. As such, WAVE 12:15 are delayed by 1.5 clocks and become valid before the first tap of the third SDL field (i.e., CP12) goes high and remain valid until after the last tap of the third SDL field (i.e., CP15) goes high. See FIG. 8C. It should be understood that boundaries between the FIELD 1, FIELD 2, and FIELD 3 are a design choice and need not necessarily be as given here.

FIG. 9A is an electrical schematic of a shifter 32 used with the waveform synthesizer 19 of the present invention. The shifter 32 comprises a plurality of two-input multiplexers 73. The inputs to the shifter 32 are control signals 71 from the deskew control 18 and pattern bits INL 70, INH 72 and SIN 74 from the pattern generator 34. The output of the shifter 32, SHFT0:15, is coupled to the pattern register 30. In the presently preferred embodiment of the invention, there are fourteen two-input multiplexers. The inputs of the first seven two-input multiplexers are coupled to pattern bits INL 70 and INH 72, respectively. Control signals 71, CTRL 0:6, are coupled in sequence with the first seven two-input multiplexers. The outputs from the first seven two-input multiplexers provide the shifter outputs, SHFT0:6. The pattern bit INH 72 is shift output SHFT 7. The inputs of the remaining seven two-input multiplexers are coupled to pattern bits INH 72 and SIN 74. Similarly, signal lines CTRL 0:6 are coupled in sequence with the remaining seven two-input multiplexers. The outputs from the remaining seven two-input multiplexers provide the shifter outputs SHFT8:14. Finally, the pattern bit SIN 74 provides the last shift output bit SHFT 15.

The shifter 32 is used to shift a pattern input to the pattern register 30 in order to change the phase relationship between the reference clock 12 and the clock-phase outputs 36 and 38. As a result of the various gate delays throughout the clock-phase synthesizer 10, the clock-phase outputs from the DTC 22 and 24 are delayed with respect to the rising edge of the reference clock 12, i.e. the waveforms are skewed with respect to the reference clock 12. See, for example, the timing diagram in FIG. 1A. The shifter 32, coupled with deskew control 18, is used to perform deskewing of the waveform with respect to the reference clock 12. By shifting the pattern input to the DTC to the left, the output delays of the waveforms are decreased. With the proper shift amounts, the output clock-phase waveforms can be deskewed entirely or nearly so with respect to the reference clock 12. Thus, the present invention generates a plurality of clock-phases from a reference clock which has a frequency equal to or less than that of the clock-phases.

Since the pattern inputs to the shifter 32 comprise two or three strings of identical bits, the patterns may be compressed thereby simplifying the shifter 32 to have only three input bits—one for each string—rather than to have 16 separate input bits as would be necessary for a general purpose shifter. Referring again to FIG. 9A, the three pattern bits input to the shifter 32 are output signals from the pattern generator 34 and are designated as INL 70, INH 72 and SIN 74. The shift-control signals 71 are outputs from the deskew control 18 and are designated as CTRL0:6. The shifted pattern bits from the shifter 32 are provided as inputs to the pattern register 30. The values of INL 70, INH 72 and SIN 74 which implement the three clock-phase patterns for clock-phase output 38 are as follows for the various input patterns:

| Pattern | INL | INH | SIN | Comment |
|---|---|---|---|---|
| 1111111000000001 | 1 | 0 | 1 | Normal cycle |
| 1111111111111110 | 1 | 1 | 0 | First clock of stretch cycle |
| 0000000000000001 | 0 | 0 | 1 | Second clock of stretch cycle |

The shift-control signals 71 control left-shifting as follows:

| CTRL0 | CTRL1 | CTRL2 | CTRL3 | CTRL4 | CTRL5 | CTRL6 | Shift-Left Amount |
|---|---|---|---|---|---|---|---|
| 0 | 0 | 0 | 0 | 0 | 0 | 0 | 0 |
| 0 | 0 | 0 | 0 | 0 | 0 | 1 | 1 |
| 0 | 0 | 0 | 0 | 0 | 1 | 1 | 2 |
| 0 | 0 | 0 | 0 | 1 | 1 | 1 | 3 |
| 0 | 0 | 0 | 1 | 1 | 1 | 1 | 4 |
| 0 | 0 | 1 | 1 | 1 | 1 | 1 | 5 |
| 0 | 1 | 1 | 1 | 1 | 1 | 1 | 6 |
| 1 | 1 | 1 | 1 | 1 | 1 | 1 | 7 |

The minimum shift amount is zero, while the maximum shift amount is 7TP/16, where TP is one tap of the 16 taps of the DTC. Implementing a shift amount greater than 7TP/16 would have entailed an unnecessary complication to the SHIFTER. The shift amount of 7TP/16 proved to be sufficient even at the maximum external frequency in MOS mode of 80 MHz (internal frequency of 40 MHz) under slow conditions (TTT, temperature=120 degrees, VCC=4.0 V), where the required shift amount is greatest. Under those conditions, a shift amount of six was observed, meaning that the full shift capability of the SHIFTER was not needed even under worst-case slow conditions.

Not only does the present invention generate a plurality of clock-phases from a reference clock which has a frequency equal to or less than that of the clock-phases, but the present invention also varies the duty cycle of the clock-phases to values other than 50%. With the prior art techniques, the duty cycle of the clock-phase outputs is limited to a single value of 50%. Under the present invention, the duty cycle of the clock-phase outputs can be varied to any arbitrary value. This is accomplished by changing the output from the shifter 32. In the presently preferred embodiment, the ratio of 1s and 0s of the output, SHFT 0:15, is 1:1. By altering the ratio of 1s and 0s of the shifter's output, duty cycles other than 50% are obtained. It follows that the duty cycle of the clock-phases may be set to any arbitrary value within the resolution set by the SDL which is used to provide the reference timing for the present invention.

Moreover, by using more than one shifter for the clock-phase outputs, each clock-phase output can have a different duty cycle and phase relationship with the other clock-phase output. It should be understood that the arbitrary range of duty cycle and phase relationship should be within the resolution set by the SDL which is used to provide the reference timing for the present invention. Thus, it will be understood by those skilled in the art that the resolution of the Clock Phase Synthesizer is 1/N, where N is the number of SDL delay taps.

The pattern generator 34 provides one of the three different patterns for clock-phase waveform synthesis. The three patterns which are compressed into three pattern bits, INL, INH, and SIN are described in the preceding paragraphs. The various embodiments of a pattern generator suitable for the present invention are described in detail in the pending patent application, Ser. No. 07/444,670, filed on Dec. 1, 1989 and entitled "METHOD AND APPARATUS FOR SYNTHESIZING DIGITAL WAVEFORMS". For instance, a "hard-wired" pattern generator may be used. Alternatively, a ROM/RAM array may function as a pattern generator. It should be understood by one skilled in the art that the pattern generators mentioned above are by no means limitations on the present invention. Furthermore, the number of bits used for the output of the pattern generator is a design choice and need not necessarily be as given here.

The three patterns INL, INH and SIN of the pattern generator 34 are generated under the control of a finite state machine FSM 76 in the deskew control 18. The pattern generator 34 is coupled to SELCPU 50 and SELPHIQ 55 and receives these two signals as inputs. See FIG. 1B. For illustration purposes, the combined state of SELCPU and SELPHIQ, SELCPU⊕SELPHIQ, is chosen to equal STREN. The pattern generator 34 is further coupled to FSM over the SIN line. The FSM 76, in turn, is coupled to CLKB 46 and SEQEN 54. The FSM 76 provides a stretch control function which is critical for debugging any integrated circuits. When stretch control is activated, the clock-phase outputs are doubled or "stretched" in width. One doubling of the clock-phase width is defined as a "stretch cycle". Stretch cycles may be initiated at any time, either individually or in chains of indefinite length. A stretch cycle is initiated by pulsing SELCPU 50 low one clock period before the start of the stretch cycle when the CLKB is in TTL (1X) mode and pulsing SELCPU 50 high two clock periods before the start of the stretch cycle when the CLKB is in MOS (2X) mode. The timing diagram of the stretch cycle in either the TTL (1X) mode and the MOS (2X) mode is illustrated in FIG. 9B. The state transition diagram of the FSM for activating the clock stretching cycles is described as follows:

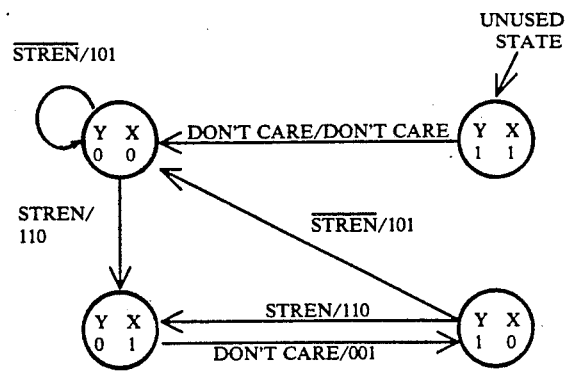

By each transition arrow appears the condition which triggers the transition and the value of the three pattern bits INL*INH*SIN output on the following clock as shown by the shifter 32 in FIG. 9A. The state variables Y X appear in the circles representing each state. The state codes were chosen so that a simple relationship exists between X, Y, INL, INH, and SIN, as follows: INL =Y#, INH=X, SIN=X#, and STREN=SELCPU⊕SELPHIQ. STREN is the sum bit of the well known Boolean operation⊕. SELCPU and SELPHIQ are input bits which are described in detail above. It is to be noted that the definitions of the pattern bits INL, INH, and SIN, as well as other input signals SELCPU, SELPHIQ, SEQEN and others, established by the preceding description are defined to explain the workings of the present invention. Further, it is to be noted that the definition of INL, INH, and SIN are arbitrarily set and do not necessarily correspond to other signals used in other well known circuits.

In non-stretch cycle, the stretch control provides the normal pattern of INL INH SIN=101 (which is the compressed version of 1111111000000001). In a stretch cycle, the pattern 110 (compressed version of 1111111111111110) is generated on the first clock of the cycle, while the pattern 001 (compressed version of 0000000000000001) is generated on the second clock. If only a single stretch cycle is initiated, then the next pattern will be 101, which is the normal pattern. However, if another stretch cycle has been initiated back-to-back with the first cycle, then the pattern 110 will be the output. Therefore, as many back-to-back stretch cycles as desired, from one up, may be initiated.

The clock-phase stretching described above permits the straightforward debugging of any integrated circuits. The clock-phase outputs may be doubled or stretched in period in any clock cycle for any number of clock cycles with the stretch mechanis. This clock-phase stretching provides about twice the propagation time to most of the chip logic during the time when the stretch cycle is activated. Therefore, if a logic path in an integrated circuit is suspected of failing for lack of propagation time, the failure can be verified by activating the stretch mechanism in the clock period (high-frequency, for example) in which the suspected logic path is known to be active.

FIG. 10A is block diagram of the deskew control 18 used in the presently preferred embodiment of the invention. The deskew control 18 comprises the FSM 76, the sample window circuit 78, an AND gate 80, an up/down counter 82, and a decoder 84. The FSM 76 is coupled to the up/down counter 82 over the AND gate 80. The FSM 76 receives input signals from CLKB 46, SEQEN 54, and SIN 74. CLKB provides the buffered clock signals from the clock buffer 14. SEQEN 54 is an output signal from the sequence control 16 and halves the clock frequency of the flip-flops in the sampling window circuit 78. SIN 74 is an output signal from the pattern generator 34 and is an early indicator of when clock-phase output PHI1 36 will make a high-to-low transition. In normal (non-stretch) cycles, SIN is constantly high, so that PHI1 makes a high-to-low transition at the start of every clock. In the stretch cycles, SIN toggles on each clock, so that PHI1 makes a high-to-low transition on every other clock. One of the two outputs from FSM 76, UPDATE 77, is connected to the AND gate 80. UPDATE enables the incrementing or decrementing of the up/down counter 82. The other output from FSM 76, SMP2 79, is connected to the inputs of the sampling window circuit 78. SMP2 enables the second PHI1 sampling. The up/down counter 82 does not increment nor decrement if the output of the second PHI1 sampling is 10. (See discussion for FIG. 10C below). The state transition diagram of FSM when deskewing occurs in the stretch cycles is illustrated as follows:

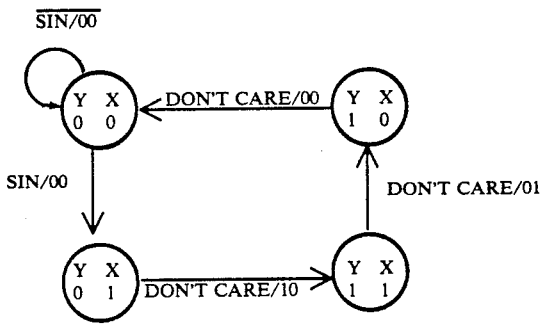

FIG. 10B is a electrical schematic of the sampling window circuit 78 used in the presently preferred embodiment of the invention. Reference clock 12 is coupled to a multiplexer 91 over at least two parallel input buffers, a TTL-level buffer 88, and a MOS-level buffer 90. The TTL-level buffer 88 has a logic threshold that is nominally 1.4 volts, while the MOS level buffer 90 has a logic threshold that is nominally 1.9 volts. Both of these buffers are self-referenced CSDAs. The SELPHIQ signal 55 is one of the output signals from the sequence control 16 and it selects the output of one of these two input buffers depending on the clock mode (TTL or MOS). An inverter chain 92 and a SDL delay stage 94 are inserted in the path leading from the reference clock 12 to the clock inputs of the first sampling flip-flops 96 and 98. Similarly, clock-phase output 36 is coupled to the D inputs of the first sampling flip-flops 96 and 98 over a plurality of inverters. By adjusting these delays individually, the sensitivity of the sampling window circuits to the clock parameters is minimized. The sampling clock window may be shifted either left or right by adjusting delays in the path from the reference clock 12 with a single mask modification: coarse adjustment may be performed with the addition or subtraction of an inverter pair, having delays of about 1.2 nanoseconds each, through modification of the METAL-1 mask only. Three inverted pairs are available with one already inserted in the path. Fine adjustment may be performed by modifying the size of the load capacitance of each inverter in the chain. The fine adjustment can be made in the polysilicon mask.

The deskew control 18 performs deskewing through negative digital feedback. The location of the falling edge of the clock-phase output 36 in relation to the rising edge of the reference clock 12 is sampled by the sampling window circuit 78. The sampling window circuit samples clock-phase output 36 at two points: on the rising edge of the reference clock 12 and a period TP/16 later. Four results of the sample are possible. See the timing diagram of PHI1 in FIG. 10C. Depending on the results of the sampling, the left-shift amount is either incremented, decremented, or left unchanged. The shift amount is incremented or decremented by the 3-bit up/down counter 82 which is commanded to count up by one, to count down by one, or not to count at all. The way this is accomplished can be seen in FIG. 10A; the output of AND 80 controls whether up/down counter 82 is enabled to count and CNTUP 83 controls the direction of counter's 82 count. The outputs of the up/down counter 82 are decoded by decoder 84 to generate CTRL0:6 71 for the shifter 32. Since clock-phase output 38 is implemented using identical circuitry as clock-phase output 36, clock-phase output 38 has a constant time relationship to clock-phase 36. Therefore, clock-phase output 38 is automatically deskewed when clock-phase output 36 is deskewed.

The sampling points at period TP/16 after the rising edge of the clock is obtained by using a special delay clock. This delay clock is generated by delaying the reference clock 12 using a single delay stage of the SDL under the control of CTRL 40, which is the static analog delay/control voltage generated by the SDL 20 that controls the end-to-end delay of the SDL.

The window sampling operation is performed using edge-triggered flip-flops. There is a small chance that the sampling flip-flops may enter a metastable state. To prevent such an occurrence from disrupting the normal operation of the deskew control circuitry 18, a full clock period, i.e. TP is provided to the sampling flip-flops 96 and 98, thereby resolving the metastable state. The effectiveness of the deskew control 18 depends on the closed-loop stability of the digital feedback. To guarantee closed-loop stability, the sampling of clock-phase output 36 must be delayed at least until the first clock in which the correction resulting from the previous sampling has appeared in clock-phase 36. The actual sampling interval that is implemented in the deskew control 18 is four clocks long. This interval is long enough to guarantee close-loop stability and to allow non-critical circuit design while it is short enough to ensure good responsiveness to skew errors in clock-phase 36.

A positive-level-triggered latch 104 is provided as part of the window sampling circuit 78. The positive level triggered latch 104 is used to prevent a possible race problem with the SEQEN 54 signal in FIG. 10B. The L-type flip-flops 96, 100 and 102 of the first and second sampling stages receive the SEQEN signal 54 from the sequence control 16. The L-type flip-flop 98 which is clocked by the delayed clock from the SDL delay stage 94 could have a race condition with the SEQEN signal. A race condition arises when a short spike or "glitch" gets through because the final NAND gate of the positive level triggered flip-flop is not disabled until the flip-flop output has a chance to go LOW. As such, under very fast conditions, SEQEN could switch before the delay clock does. The positive level-triggered latch 104 solves this problem. It delays SEQEN 54 by about ½ of a clock period (nominal) so that SEQEN will not switch before the delay clock, even under very fast conditions.

While the present invention has been particularly described with reference to FIGS. 1-10C and with emphasis on integrated circuits, it should be understood that the figures are for illustration only and should not be taken as limitations upon the invention. In addition, it is clear that the methods and apparatus of the present invention have utility in any application where clock-phase generation for sequencing the logic of a computer system is required. It is contemplated that many changes and modifications may be made by one of ordinary skill in the art, without departing from the spirit and scope of the invention as disclosed above.

I claim:

1. An integrated circuit for changing the phase relationship between at least two clock-phase outputs and a reference clock, said clock-phase outputs being generated by a digital waveform synthesizer including a synchronous delay line (SDL) coupled to at least two digital-to-time domain converters (DTCs), said SDL generating N taps, said taps corresponding to the resolution of said clock-phase outputs said DTCs outputting said clock-phase outputs, said DTCs being further coupled to a pattern register, said pattern register being coupled to a pattern generator, said integrated circuit comprising:

a sequence control coupled to said reference clock over a clock buffer for receiving a plurality of frequencies therefrom, said sequence control being further coupled to said SDL for generating a plurality of global signals for triggering said digital waveform synthesizer, said sequence control being coupled to said pattern generator for synthesizing a plurality of clock-phase waveforms;

at least one shifter coupled to said pattern register for minimizing the delays of said clock-phase outputs with respect to said reference clock, said shifter being coupled to said pattern generator for receiving a plurality of pattern bits therefrom, said plurality of pattern bits representing said plurality of clock-phase waveforms; and a deskew control being coupled to one of said clock-phase outputs and to said reference clock for determining the skew between said one of said clock-phase outputs and said reference clock, said deskew control being further coupled to said shifter for generating a plurality of control signals for minimizing the skew between said clock-phase outputs and said reference clock, said deskew control being further coupled to said pattern generator and to said sequence control for stretching the clock cycles of said clock-phase outputs in debugging the logic path of any integrated circuit.

2. The apparatus as defined in claim 1, wherein the phase relationship between at least two said clock-phase outputs is adjustable to any non-zero value within a resolution of 1/N.

3. The apparatus as defined in claim 1, wherein said clock buffer comprises a complementary self-biased differential amplifier.

4. The apparatus as defined in claim 1, wherein said sequence control comprises at least one L-type flip-flop coupled to a plurality of D-type flip-flops.

5. The apparatus as defined in claim 1, wherein said plurality of global signals for triggering said digital waveform synthesizer are generated by a reset signal and a sample signal coupled to said sequence control, said sequence control sampling said sample signal on the falling edge of said reset signal, said sequence control latching said sample signal on the rising edge of said reference clock, said rising edge of said reference clock following the falling edge of said reset signal.

6. The apparatus as defined in claim 1, wherein said shifter comprises a plurality of two-input multiplexers.

7. The apparatus as defined in claim 6, wherein said shifter shifts said clock-phase waveforms by a distance substantially equal to the skew between said clock-phase outputs and said reference clock.

8. The apparatus as defined in claim 6, wherein said plurality of two-input multiplexers are coupled to said plurality of pattern bits, said plurality of two-input multiplexers being further coupled to said control signals, said plurality of two-input multiplexers maintaining the shift initiated by said shift control for each clock cycle of said clock-phase output.

9. The apparatus as defined in claim 1, wherein said deskew control comprises a sampling window circuit and a finite state machine coupled to said shifter over an AND gate, a up/down counter, and a decoder.

10. The apparatus as defined in claim 9, wherein said sampling window circuit further comprises a reference clock delay stage coupled to a first sampling stage, said first sampling stage being further coupled to a second sampling stage, said first sampling stage sampling and storing said clock-phase output at a first time interval of said reference clock, said second sampling stage sampling and storing said clock-phase output at a second time interval delayed from said first time interval of said reference clock, said sampling window circuit being further coupled to said decoder over said up/down counter, said sampling window circuit determining the skew between said clock-phase outputs and said reference clock, said up/down counter generating said control signals that permit said shifter to shift said clock-phase waveforms by a distance substantially equal to the skew between said clock-phase outputs and said reference clock.

11. The apparatus as defined in claim 9, wherein said finite state machine providing said control signal for stretching the clock phase of said output clock phase by doubling the phase width of said clock-phase output.

12. The apparatus as defined in claim 11, wherein said doubling of said phase width is initiated at any time.

13. The apparatus as defined in claim 11, wherein said doubling of said phase width is initiated individually.

14. The apparatus as defined in claim 11, wherein said doubling of said phase width is initiated in chains of indefinite length.

15. The apparatus as defined in claim 9, wherein said finite state machine provides said control signal for adjusting the duty cycle of said clock-phase outputs independently of each other.

16. The apparatus as defined in claim 15, wherein said duty cycle is a value other than 50%.

17. The apparatus as defined in claim 15, wherein said duty cycle is a value of 50%.

18. The apparatus as defined in claim 1, wherein said sequence control is coupled to a first control signal for selecting whether said clock-phase outputs operate at said reference frequency or at double said reference frequency.

* * * * *

UNITED STATES PATENT AND TRADEMARK OFFICE
CERTIFICATE OF CORRECTION

PATENT NO. : 5,036,230
DATED : 7/30/91
INVENTOR(S) : Bazes

It is certified that error appears in the above-identified patent and that said Letters Patent is hereby corrected as shown below:

Column 11, line 13, after "invention." please insert --Thus, it will be understood by those skill in the art that the resolution of the Clock Phase Synthesizer is 1/N, where N is the number of SDL delay taps.--.

Column 11, lines 21-23, after "invention." --Thus, it will be understood by those skilled in the art that the resolution of the Clock Phase Synthesizer is 1/N, where N is the number of SDL delay taps.-- should be deleted.

Signed and Sealed this

Twenty-sixth Day of April, 1994

Attest:

BRUCE LEHMAN

*Attesting Officer*  Commissioner of Patents and Trademarks